(12) United States Patent
Asai et al.

(10) Patent No.: US 9,337,113 B2
(45) Date of Patent: May 10, 2016

(54) SEMICONDUCTOR DEVICE

(71) Applicants: Rintaro Asai, Toyota (JP); Atsushi Tanida, Nisshin (JP)

(72) Inventors: Rintaro Asai, Toyota (JP); Atsushi Tanida, Nisshin (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/437,507

(22) PCT Filed: Nov. 20, 2012

(86) PCT No.: PCT/JP2012/080031
§ 371 (c)(1),
(2) Date: Apr. 22, 2015

(87) PCT Pub. No.: WO2014/080449
PCT Pub. Date: May 30, 2014

(65) Prior Publication Data
US 2015/0294920 A1    Oct. 15, 2015

(51) Int. Cl.
*H01L 23/02* (2006.01)
*H01L 23/52* (2006.01)
(Continued)

(52) U.S. Cl.
CPC .............. *H01L 23/10* (2013.01); *H01L 21/52* (2013.01); *H01L 23/051* (2013.01); *H01L 23/4334* (2013.01); *H01L 23/48* (2013.01); *H01L 23/49513* (2013.01); *H01L 23/49562* (2013.01); *H01L 23/49582* (2013.01); *H01L 24/29* (2013.01); *H01L 24/32* (2013.01); *H01L 24/33* (2013.01); *H01L 24/83* (2013.01); *H01L 23/3107* (2013.01); *H01L 24/48* (2013.01); *H01L 2224/29101* (2013.01);
(Continued)

(58) Field of Classification Search
CPC ... H01L 23/10; H01L 23/49582; H01L 24/33; H01L 2224/335
USPC ................. 257/625, 666, 667, 669, 678, 712, 257/E23.012, E23.014, E23.023, E23.092, 257/E23.159, E25.016, E21.51, E21.504, 257/E21.582; 438/106, 123, 124, 127, 584
See application file for complete search history.

(56) References Cited

U.S. PATENT DOCUMENTS 7,193,326 B2 * 3/2007 Hirano ................. H01L 23/482
257/765
8,405,194 B2 * 3/2013 Nishihata .............. H01L 23/473
257/675
(Continued)

FOREIGN PATENT DOCUMENTS

JP    2005-019699 A    1/2005
JP    2006-179655 A    7/2006
(Continued)

*Primary Examiner* — Dao H Nguyen
(74) *Attorney, Agent, or Firm* — Oliff PLC

(57) ABSTRACT

A semiconductor device includes a transistor, lead frames, a metal spacer, one surface of which is bonded to the transistor by a first bonding material and the other surface of which is bonded to the lead frame by a second bonding material, and a plastic mold. The plastic mold packages the transistor and the metal spacer. One surface of each of the lead frames is attached to the plastic mold. Strength of the second bonding material is lower than strength of the first bonding material. According to the above configuration, when stress is repeatedly applied to the semiconductor device, a crack occurs earlier in the second bonding material than in the first bonding material. The stress is buffered at the first bonding material.

8 Claims, 3 Drawing Sheets

(51) Int. Cl.

| | | |
|---|---|---|
| *H01L 21/48* | (2006.01) | |
| *H01L 23/10* | (2006.01) | |
| *H01L 23/00* | (2006.01) | |
| *H01L 23/051* | (2006.01) | |
| *H01L 23/433* | (2006.01) | |
| *H01L 23/495* | (2006.01) | |
| *H01L 23/48* | (2006.01) | |
| *H01L 21/52* | (2006.01) | |
| *H01L 23/31* | (2006.01) | |

(52) U.S. Cl.
CPC ............... *H01L 2224/29339* (2013.01); *H01L 2224/29355* (2013.01); *H01L 2224/32245* (2013.01); *H01L 2224/335* (2013.01); *H01L 2224/48091* (2013.01); *H01L 2224/48247* (2013.01); *H01L 2224/73265* (2013.01); *H01L 2224/8382* (2013.01); *H01L 2224/83825* (2013.01); *H01L 2924/00014* (2013.01); *H01L 2924/0132* (2013.01); *H01L 2924/13055* (2013.01); *H01L 2924/13091* (2013.01); *H01L 2924/181* (2013.01)

(56) References Cited

U.S. PATENT DOCUMENTS

| | | | | |
|---|---|---|---|---|
| 8,492,256 | B2* | 7/2013 | Urano | H01L 21/6836 438/309 |
| 8,884,411 | B2* | 11/2014 | Kadoguchi | H01L 23/49548 257/625 |
| 9,035,438 | B2* | 5/2015 | Hayashi | H01L 23/34 257/666 |
| 2003/0052400 | A1* | 3/2003 | Okura | H01L 23/293 257/691 |
| 2003/0122232 | A1* | 7/2003 | Hirano | H01L 23/4334 257/678 |
| 2005/0077599 | A1* | 4/2005 | Miura | H01L 23/4334 257/669 |
| 2005/0145999 | A1* | 7/2005 | Mamitsu | H01L 21/565 257/667 |

FOREIGN PATENT DOCUMENTS

| | | |
|---|---|---|
| JP | 2008-041707 A | 2/2008 |
| JP | 2013-069877 A | 4/2013 |
| JP | 2014-056917 A | 3/2014 |

* cited by examiner

SEMICONDUCTOR DEVICE

TECHNICAL FIELD

The present invention relates to a semiconductor device. Particularly, the present invention relates to a semiconductor device having a semiconductor element molded with plastic, with the semiconductor element bonded to a lead frame exposed on a molded surface. Such a semiconductor device may be referred to as a semiconductor card or a semiconductor package.

BACKGROUND ART

In an inverter and a voltage converter configured to drive a motor for running an electric automobile, there is a case where a semiconductor device (a semiconductor package) having a semiconductor element handling a large amount of current molded with plastic, is used (refer to Japanese Patent Application Publication No. 2006-179655). A typical example of such a semiconductor element is a transistor used in a switching circuit. Hereinafter, a block of plastic which molds a semiconductor element will be also referred to as a "plastic mold". The plastic mold is formed by an injection molding. Metal plates called lead frames are respectively attached to both sides of the plastic mold. The semiconductor element inside the plastic mold is bonded to each of the lead frames. The lead frame is sometimes used as an electrode, and is also used as a mere heat sink. A solder material is typically used for bonding between the lead frame and the semiconductor element. However, materials other than the solder material, such as nickel nanoparticles for example may be used for the bonding. Hereinafter, a material for bonding the lead frame and the semiconductor element will be called a "bonding material".

A semiconductor element is molded with plastic for purposes of protecting the semiconductor element from external dusts and moisture, and suppressing fatigue degradation of a bonding material that bonds the semiconductor element and the lead frame. Because the semiconductor element and the lead frame have different coefficients of thermal expansion, stress is repeatedly applied to the bonding material in a heat cycle generated by the semiconductor element. Deformation of the semiconductor element and the lead frame can be suppressed by molding a part of the lead frame and the semiconductor element with the plastic. As a result, the stress applied to the bonding material is suppressed, and accordingly the fatigue degradation of the bonding material is suppressed.

SUMMARY OF INVENTION

Even when molding with the plastic, has been performed, fatigue degradation is gradually developed. A crack may occur in some cases in a bonding material that bonds a semiconductor element when the fatigue degradation has developed to a certain level. The crack generated in the bonding material in contact with the semiconductor element may cause an adverse effect on the semiconductor element. Accordingly, the present specification provides a technology for reducing the influence of the crack occurrence exerted on the semiconductor element, even when the fatigue degradation is developed to an extent that a possibility of the crack being generated in the bonding material is increased.

With regards to a current path, if the bonding material is broken at a place other than a place where the semiconductor element is directly in contact with, an electric resistance increases, however, an influence exerted on the semiconductor element due to the breakage is small. Accordingly, according to the technology disclosed in the present specification, a metal spacer is provided between a semiconductor element and a lead frame. Then, the semiconductor element and the metal spacer are bonded by a first bonding material, and the metal spacer and the lead frame are bonded by a second bonding material. A material of which strength is lower than strength of the first bonding material is used for the second bonding material. Further, the metal spacer may be a conductive metal block or a metal plate.

According to the above configuration, when stress is repeatedly applied between the semiconductor element and the lead frame, a crack occurs earlier in the bonding part between the lead frame and the metal spacer than in the bonding part between the semiconductor element and the metal spacer. However, the crack which occurs in the bonding part between the lead frame and the metal spacer does not cause damage to the semiconductor element. Alternatively, even if damage is caused to the semiconductor element then, the damage is small. Therefore, even if an electric resistance increases due to a damage caused to the bonding part between the lead frame and the metal spacer, the influence exerted on the semiconductor element is small. Further, distortion caused by a difference between the coefficient of thermal expansion of the lead frame and the coefficient of thermal expansion of the semiconductor element is absorbed by the broken bonding part. Accordingly, the stress is buffered at the bonding part between the semiconductor element and the metal spacer, resulting in less likelihood that the bonding part is broken.

In other words, according to the technique disclosed in the present specification, a relatively weak bonding part is provided at a position which is not in contact with a semiconductor element, among between the semiconductor element and a lead frame, such that a crack is caused to be generated first in the bonding part. Such a configuration protects the bonding part in contact with the semiconductor element, and consequently the influence exerted on the semiconductor element by the crack generated by the fatigue deterioration is suppressed.

According to the technology disclosed in the present specification, a material having lower strength than the strength of the first bonding material is used for the second bonding material. In this case, the "strength" herein means strength against a stress concentration, and may be physically defined by any one of two different indexes. One definition is determined by a lifetime prediction based on a predetermined criterion. The lifetime prediction can be specified by an endurance test and/or by a simulation. For example, a test in which a load is applied repeatedly to a bonding material is performed under predetermined temperature and load conditions, and the bonding material is determined to have higher strength as the number of load applications before a crack occurs is larger. Notably, there is no endurance test which is common to all semiconductor devices, and therefore a test condition is determined according to an environment in which the semiconductor device is used.

The other definition concerning the "strength" is a definition according to a size of yield strength (a yield stress). The larger yield strength means the higher strength of a bonding material. In a case of a metal of which yield strength cannot be defined, 0.2% proof stress may be substituted for the yield strength. The "0.2% proof stress" is defined by a stress of when a distortion amount has reached 0.2%, with regard to a metal having no clear yield point. Employing a value of the 0.2% proof stress as a substitute for the yield strength for the metal having no clear yield point, is a general technique widely implemented in a technical field of material mechanics. In the present specification, the "0.2% proof stress" will be also handled as one type of the "yield strength".

Whether the lifetime prediction (for example, a result of the endurance test) is to be employed or the yield strength is to be employed as the "strength" depends on an environment in which a semiconductor device is used. It is preferable to determine the strength by the lifetime prediction in an environment in which an average repeated stress with little variation is continuously applied. On the other hand, in an environment in which a variation of a stress is relatively large and also there is a high possibility that a bonding material may be broken by a large stress applied once or a few times without spending long time, it is preferable to determine the stress by the yield stress. Alternatively, it is also suitable to determine the strength by setting a special evaluation function by merging the lifetime prediction and the yield strength. Repeatedly mentioning, there is no single criterion for the "strength", and the "strength" in the technology disclosed in the present specification is not necessarily a specific criterion. Technical concept disclosed in the present specification is to select, as a second bonding material, a substance having a high likelihood of being broken earlier than a first bonding material by a repeated stress generated by heat of a semiconductor element.

The first and second bonding materials may be different kinds of solder materials, or may be bonding materials other than the solder materials. In a technical field of semiconductor devices, bonding materials including solder materials are collectively referred to as "die bond". The die bond contains nickel nanoparticles and/or silver nanoparticles, in addition to the solder materials. Further, the bonding material may be an insert material used in diffusion bonding. That is, in the case of the diffusion bonding, a bonding portion at which the insert material is diffused itself may be included in the "bonding material" in the present specification.

Details of the technology disclosed in the present specification and further improvements will be described in "Description of Embodiments" below.

DESCRIPTION OF EMBODIMENTS

Figure 1:
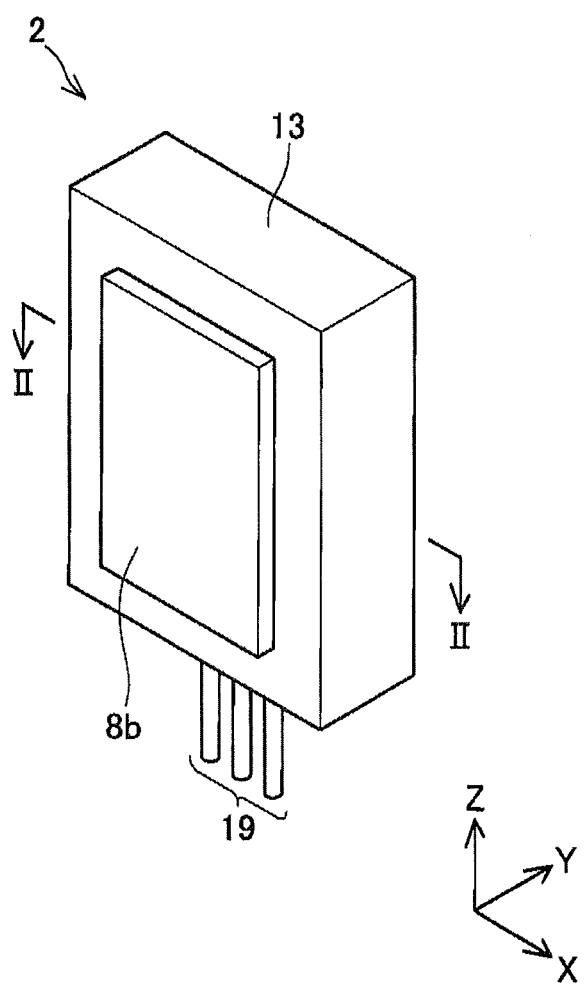
FIG. 1 is a schematic perspective view of a semiconductor device according to a first embodiment.
Figure 2:
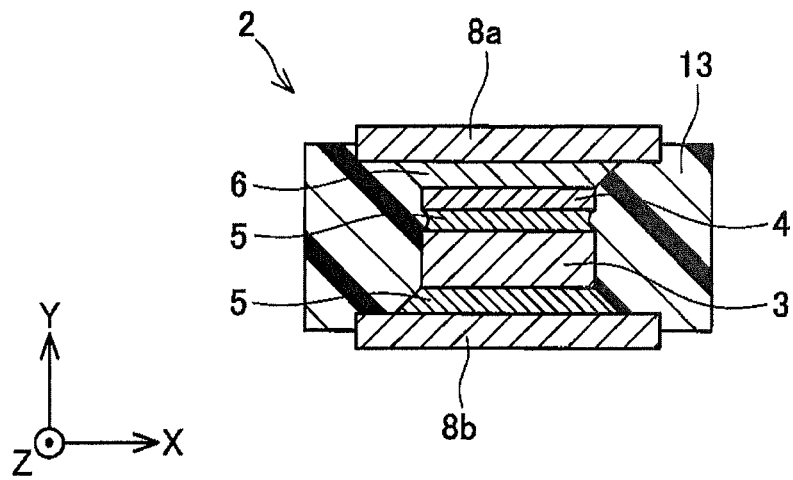
FIG. 2 is a sectional view along an arrow line in FIG. 1.

FIG. 1 shows a schematic perspective view of a semiconductor device 2 according to a first embodiment. FIG. 2 shows a sectional view along an arrow line II-II of FIG. 1. The semiconductor device 2 is used for a switching circuit of an inverter configured to supply current to a motor for running an electric automobile, for example. The semiconductor device 2 includes a configuration in which a transistor 3 is molded with plastic. The transistor 3 is a MOS transistor using an SiC substrate or an IGBT, for example. The transistor 3 corresponds to an example of a semiconductor element.

An epoxy based material having high strength, for example, is used for the plastic that molds the transistor 3. The whole plastic molding the transistor 3 will be referred to as a plastic mold 13. The plastic mold 13 is formed in a shape of cuboid, and lead frames 8a and 8b (electrode plates) are fixed to two broadest surfaces of the cuboid. As clearly shown in FIG. 2, a half portion of each of the lead frames 8a and 8b is embedded in the plastic mold 13 in a thickness direction. The lead frames 8a and 8b are conductors (metal), and are connected to an emitter and a collector (or a drain and a source) of the transistor 3. The emitter and the collector of the transistor 3 are exposed on a surface of the transistor 3. A conductive part exposed on a surface of the transistor 3 may be referred to as a surface electrode. The lead frames 8a and 8b are equivalent to electrode terminals of the transistor 3 for being connected to an external device. Further, a control electrode 19 of the transistor 3 is extended out from the plastic mold 13. Because a large current flows in the lead frames 8a and 8b connected to the emitter and the collector, metal plates (lead frames) having a large area are used for these electrodes; and because a large current does not flow in the control electrode 19 connected to a gate, thin metal bars are used for the control electrode 19.

As shown in FIG. 2, one surface (a surface electrode) corresponding to the emitter (or the collector) of the transistor 3 is bonded to the lead frame 8b via a first solder material 5. Another surface (a surface electrode) corresponding to the collector (or the emitter) of the transistor 3 is bonded to one surface of a metal spacer 4 via the first solder material 5. The other surface of the metal spacer 4 is bonded to the other lead frame 8a via a second solder material 6. In other words, the metal spacer 4 is positioned between the lead frame 8a and the transistor 3, one surface of the metal spacer 4 is bonded to the transistor 3 by the first solder material 5, and the other surface at the opposite side of the one surface of the metal spacer 4 is bonded to the lead frame 8a by the second solder material 6. As will be described in detail later, strength of the second solder material 6 is lower than strength of the first solder material 5. The metal spacer 4 is inserted into between the transistor 3 and the lead frame 8a, in order to use the solder material at a position not in contact with the transistor 3. Then, the second solder material 6 of lower strength is used at the position not in contact with the transistor 3.

The metal spacer 4 also plays a role of filling a distance between the transistor 3 and the plastic mold 13 because a thickness of the plastic mold 13 is relatively large as compared with a thickness of the transistor 3. The metal spacer 4 is a conductive metal block or metal plate. A solder material at each position may be also referred to as a bonding part that bonds materials at both sides of the solder material.

As described above, the material having lower strength than the strength of the first solder material 5 is used as the second solder material 6. 0.2% proof stress is employed for a criterion of the "strength". An Sn—Cu solder material is known as a material of which 0.2% proof stress is relatively low. The Sn—Cu solder material is an alloy including tin (Sn) as a main constituent, and including copper (Cu) in a trace amount up to about 0.7 (weight percent). For candidates of the first solder material 5, there are an Sn—Sb solder material and a Zn—Al solder material, for example. The Sn—Sb solder material is an alloy including tin (Sn) as a main constituent, and including antimony (Sb) by about 5 to 13 (weight percent). The Zn—Al solder material is an alloy including zinc (Zn) as a main constituent, and including aluminum (Al) by about 4 to 6 (weight percent). The 0.2% proof stress of both of the Sn—Sb solder material and the Zn—Al solder material is higher than the 0.2% proof stress of the Sn—Cu solder material.

Figure 3:
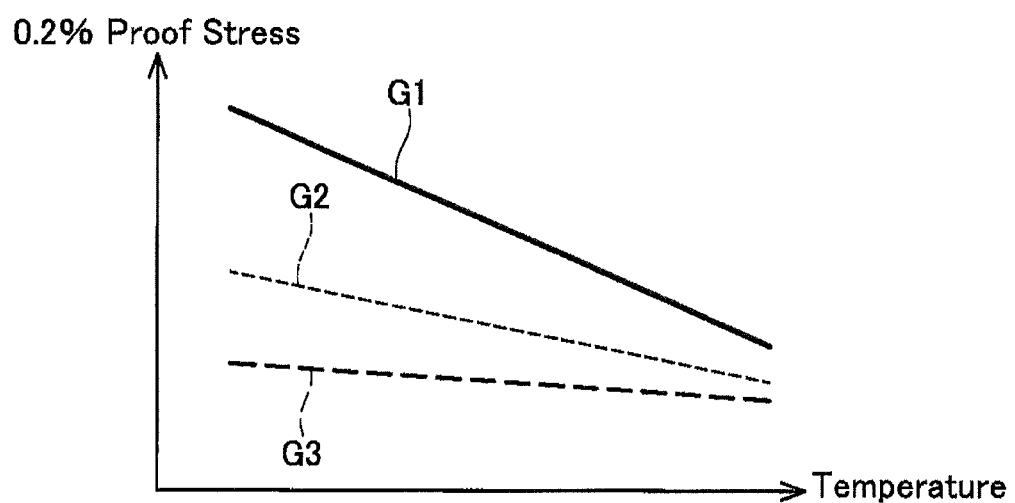
FIG. 3 is a graph showing an example of yield strength (a 0.2% proof stress) of a first bonding material, a second bonding material, and a surface electrode of an element.

FIG. 3 shows a graph schematically expressing a difference in 0.2% proof stress among a surface electrode of the transistor 3 and the solder materials. The surface electrode of the transistor 3 is an electrode exposed on a surface of a chip of the transistor 3. The surface electrode is made typically of an Al—Si alloy (an aluminum-silicon alloy). In a coordinate system in FIG. 3, a vertical axis represents a 0.2% proof stress, and a lateral axis represents a temperature. Graph G1 represents a 0.2% proof stress of the first solder material (the Sn—Sb solder material or the Zn—Al solder material), Graph G2 represents a 0.2% proof stress of the surface electrode, and Graph G3 represents a 0.2% proof stress of the second solder material (the Sn—Cu solder material). Each 0.2% proof stress is decreased in accordance with a rise in the temperature, and always satisfies a relationship: the first solder material>the surface electrode>the second solder material. (It should be mentioned herein that according to the technology disclosed in the present specification, the relationship may alternatively be: the surface electrode>the first solder material>the second solder material.)

That is, the strength of the second solder material is the lowest at any temperature. This indicates that the second solder material is likely to be most severely deteriorated and to cause a crack occurs in the second solder material at the earliest timing as a heat cycle is repeated. Notably, the heat cycle occurs by heat generation of the transistor 3 while the semiconductor device is used for a long period of time.

In a case where the semiconductor device 2 is used for a long period of time, a crack occurs first in the second solder material having low strength, that is, in the bonding part between the metal spacer 4 and the lead frame 8a. An electric resistance between the metal spacer 4 and the lead frame 8a is increased when the crack is generated. Therefore, performance of the semiconductor device 2 deteriorates. However, the crack does not affect the transistor 3, and does not cause the transistor 3 to be broken.

Another advantage of introducing the second solder material 6 will be described. In the semiconductor device 2, the transistor 3 and the metal spacer 4 are stacked and bonded by two kinds of the solder materials 5 and 6, between the two lead frames 8a and 8b. When the transistor 3 generates heat, a stress is caused to each component due to different coefficients of thermal expansion of the transistor, the lead frame, and the like. When a crack occurs in the bonding part between the metal spacer 4 and the lead frame 8a, that is, in the second solder material 6, bonding force is reduced such that it becomes easy for the metal spacer 4 and the lead frame 8a to be displaced relative to each other. Then, the displacement between the metal spacer 4 and the lead frame 8a relaxes a stress generated in other portions (the transistor 3 and the first solder material 5). Accordingly, deterioration of the first solder material 5 bonding the transistor 3 is suppressed. That is, development of deterioration of the first solder material 5 is suppressed by the occurrence of a crack in the second solder material 6.

Figure 4:
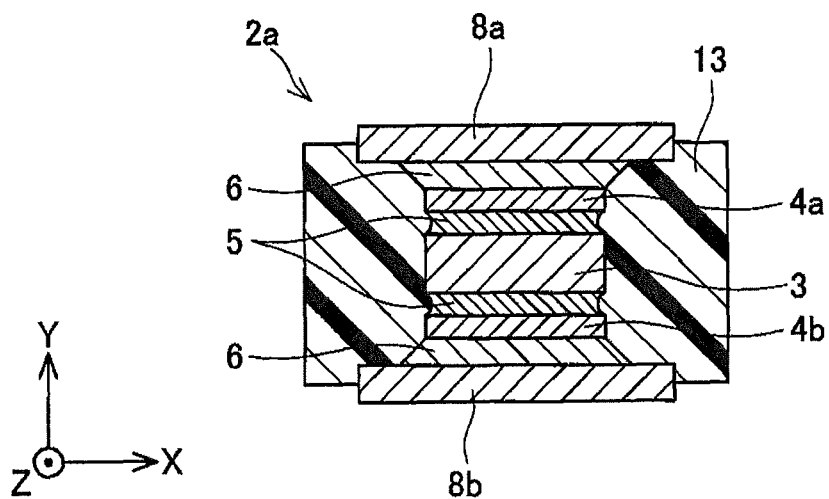
FIG. 4 is a sectional view of a semiconductor device according to a second embodiment.

A semiconductor device 2a according to a second embodiment will be described with reference to FIG. 4. The semiconductor device 2a includes metal spacers 4a and 4b provided respectively at both sides of a transistor 3. At respective sides of the transistor 3, the transistor 3 is bonded to the metal spacer 4a (4b) via a first solder material 5. An opposite side of the metal spacer 4a (4b) is bonded to a lead frame 8a (8b) via a second solder material 6. In other words, in the semiconductor device 2a, the lead frames 8a and 8b are respectively fixed to both sides of a plastic mold 13; the respective lead frames 8a and 8b are bonded to the metal spacers 4a and 4b respectively by the second bonding materials 6; the transistor 3 is provided between the two metal spacers 4a and 4b; and the two metal spacers 4a and 4b are respectively bonded to the transistor 3 via the first solder materials 5. According to this configuration, the strength of the bonding part (the second solder material 6) between the lead frame 8a and the metal spacer 4a and the strength of the bonding part (the second solder material 6) between the lead frame 8b and the metal spacer 4b are lower than the strength of the bonding parts (the first solder materials 5) at both sides of the transistor 3. Therefore, a crack may occur in the bonding part between the lead frame 8a and the metal spacer 4a or in the bonding part between the lead frame 8b and the metal spacer 4b earlier than in the bonding parts at both sides of the transistor 3. As compared with the semiconductor device 2 of the first embodiment, because the bonding parts of lower strength are provided at two positions, it becomes less likely that a crack may occur at both sides of the transistor 3.

Figure 5:
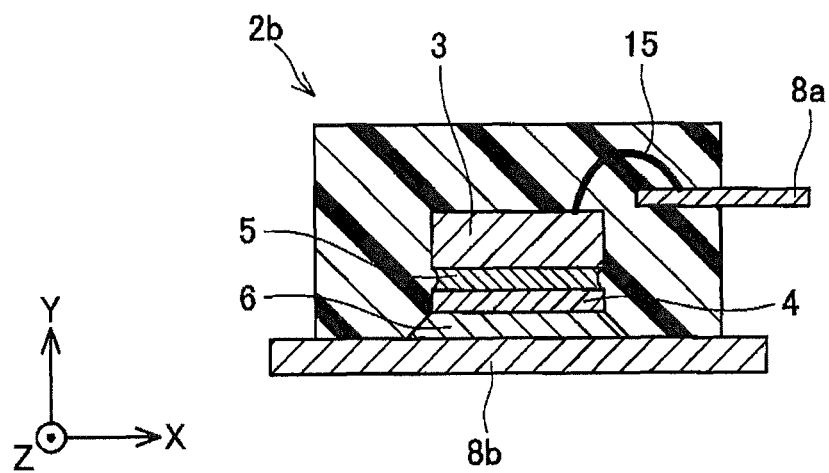
FIG. 5 is a sectional view of a semiconductor device according to a third embodiment.

A semiconductor device 2b according to a third embodiment will be described with reference to FIG. 5. According to the semiconductor device 2b, a metal spacer 4 is bonded above to a lead frame 8b via a second solder material 6, and a transistor 3 is bonded to the metal spacer 4 via a first solder material 5. In other words, the metal spacer 4 is provided and bonded between the transistor 3 and the lead frame 8b. Further, the transistor 3 and another lead frame 8a are electrically connected by a wire bonding 15. The transistor 3 and the metal spacer 4 are molded with plastic on the lead frame 8b. The lead frame 8a is a thin-plate shape metal bar, one end of the metal bar is embedded in the plastic, and the other end thereof is exposed from the plastic. The semiconductor device 2b is different from the above semiconductor devices 2 and 2a in that the one lead frame 8a and the transistor 3 are connected by the wire bonding. In the semiconductor device 2b according to the third embodiment, the metal spacer 4 is also provided between the lead frame 8b and the transistor 3; the metal spacer 4 and the transistor 3 are also bonded by the first solder material 5; and the metal spacer 4 and the lead frame 8b are also bonded by the second solder material 6. Therefore, a crack may occur earlier in the bonding part between the metal spacer 4 and the lead frame 8b than in the bonding part between the transistor 3 and the metal spacer 4, and occurrence of a crack at a position in contact with the transistor 3 can be suppressed. The semiconductor device 2b according to the third embodiment has also the same advantages as those of the above semiconductor devices 2 and 2a.

Points of attention concerning the technologies described in the embodiments will be described. The first solder material 5 is an example of the first bonding material, and the second solder material 6 is an example of the second bonding material. In the embodiments, a 0.2% proof stress is used as a criterion of the strength of the bonding material (the solder material). The criterion of the strength may not necessarily be the 0.2% proof stress. When it is possible to measure a yield stress of a bonding material, the yield stress may be applied as a criterion of the strength. Alternatively, a predetermined lifetime prediction may be applied as a criterion of the strength. The lifetime prediction can be obtained by an endurance test and/or by simulation to evaluate a lifetime. It should be mentioned herein that various definitions exist for the "strength" of the material. Any kind of definition of the strength may be employed in the technologies disclosed in the present specification.

In the embodiments, the Sn—Sb solder material and the Zn—Al solder material are presented as candidates of the first solder material 5, and the Sn—Cu solder material is presented as a candidate of the second solder material 6. The first bonding material and the second bonding material may not necessarily be these solder materials. The second bonding material may be a material having lower strength than that of the first bonding material. Other candidates of the first bonding material may include Ni nanoparticles and Ag nanoparticles. These nanoparticles are known as bonding materials that bond two metals. 0.2% proof stress of the Ni nanoparticles and Ag nanoparticles as the bonding materials is higher than that of the Sn—Cu solder material. Further, for bonding between the transistor and the metal spacer, it is also suitable to employ TLP (Transient Liquid Phase Diffusion Bonding) for forming CuSn by using Cu (copper) as a base material and using Sn (tin) as an insert material, and alternatively to employ TLP for forming NiSn by using Ni (nickel) as a base material and using Sn (tin) as an insert material. The strength of these materials is also higher than the strength of the Sn—Cu solder material. Notably in the case of the TLP, a diffusion region of the insert material corresponds to the "bonding material".

The technology disclosed in the present specification may not necessarily be the semiconductor device that molds a transistor. The technology can be also suitably applied to a semiconductor device that molds a diode, for example, other than the transistor.

Specific examples of the present invention has been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

The invention claimed is:

1. A semiconductor device comprising:
   a semiconductor element;
   a lead frame;
   a metal spacer provided between the semiconductor element and the lead frame; and
   a plastic mold packaging the semiconductor element and the metal spacer, and attached to one surface of the lead frame,
   wherein the metal spacer and the semiconductor element are bonded by a first bonding material, and the metal spacer and the lead frame are bonded by a second bonding material, and
   strength of the second bonding material is lower than strength of the first bonding material.

2. The semiconductor device according to claim 1, wherein the strength is determined by a lifetime prediction based on a predetermined criterion.

3. The semiconductor device according to claim 1, wherein the strength is determined by a yield stress or a 0.2% proof stress.

4. The semiconductor device according to claim 1, wherein
   lead frames are fixed on both sides of the plastic mold, respectively, and
   the metal spacer and at least one of the lead frames are bonded by the second bonding material.

5. The semiconductor device according to claim 4, wherein
   another metal spacer and the other of the lead frames are bonded by the second bonding material, and
   the other metal spacer and the semiconductor element are bonded by the first bonding material.

6. The semiconductor device according to claim 1, wherein the second bonding material is a Sn—Cu solder material.

7. The semiconductor device according to claim 1, wherein the first bonding material is selected from the group consisting of a Sn—Sb solder material, a Zn—Al solder material, nickel nanoparticles, and silver nanoparticles.

8. The semiconductor device according to claim 1, wherein the semiconductor element and the metal spacer are bonded by diffusion bonding that uses an insert material as the first bonding material.

* * * * *